US011316252B2

(12) United States Patent
Wu et al.

(10) Patent No.: US 11,316,252 B2
(45) Date of Patent: Apr. 26, 2022

(54) ANTENNA PACKAGING STRUCTURE AND METHOD FOR FORMING THE SAME

(71) Applicant: SJ SEMICONDUCTOR (JIANGYIN) CORPORATION, JiangYin (CN)

(72) Inventors: Chengtar Wu, JiangYin (CN); Yenheng Chen, JiangYin (CN); Chengchung Lin, JiangYin (CN); Yayuan Xue, JiangYin (CN); Han Xu, JiangYin (CN)

(73) Assignee: SJ SEMICONDUCTOR (JIANGYIN) CORPORATION, Jiangyin (CN)

( * ) Notice: Subject to any disclaimer, the term of this patent is extended or adjusted under 35 U.S.C. 154(b) by 0 days.

(21) Appl. No.: 17/133,382

(22) Filed: Dec. 23, 2020

(65) Prior Publication Data

US 2021/0391637 A1 Dec. 16, 2021

(30) Foreign Application Priority Data

Oct. 25, 2019 (CN) ......................... 201911021293.0
Oct. 25, 2019 (CN) ......................... 201921804349.5

(51) Int. Cl.

*H03M 1/22* (2006.01)
*H01Q 1/22* (2006.01)
*H01Q 1/40* (2006.01)
*H01Q 21/00* (2006.01)

(52) U.S. Cl.

CPC ............ *H01Q 1/2283* (2013.01); *H01Q 1/40* (2013.01); *H01Q 21/0087* (2013.01)

(58) Field of Classification Search

CPC ..... H01Q 1/2283; H01Q 1/40; H01Q 21/0087
USPC .......................................................... 343/702
See application file for complete search history.

(56) References Cited

U.S. PATENT DOCUMENTS 6,552,555 B1 * 4/2003 Nuytkens ........... G01R 31/2886
324/750.02
2019/0163939 A1 * 5/2019 Yamamoto ............... H01Q 7/06

* cited by examiner

*Primary Examiner* — Peguy Jean Pierre
(74) *Attorney, Agent, or Firm* — Alston & Bird LLP

(57) ABSTRACT

The present disclosure provides an antenna packaging structure and a method for forming the same. The structure includes: a supporting substrate, a rewiring layer on the supporting substrate, a first antenna layer disposed on the rewiring layer, first metal feedline pillars disposed on the first antenna layer, a first packaging layer covering the first metal feedline pillars except exposing the top surfaces of the first metal feedline pillars; a second antenna layer on the first packaging layer, second metal feedline pillars, a second packaging layer covering the second metal feedline pillars except exposing the top surfaces of the second metal feedline pillars; a third antenna layer disposed on the second packaging layer, semiconductor chips connected to the rewiring layer, a metal bump disposed inside an opening in the rewiring layer, and a third packaging layer encapsulating the semiconductor chips and the metal bump.

16 Claims, 10 Drawing Sheets

ANTENNA PACKAGING STRUCTURE AND METHOD FOR FORMING THE SAME

CROSS REFERENCE TO RELATED APPLICATIONS

The present application claims the benefit of priority to Chinese Patent Application No. CN 2019110212930, titled "ANTENNA PACKAGING STRUCTURE AND METHOD FOR FORMING THE SAME", filed with CNIPA on Oct. 25, 2019, and Chinese Patent Application No. CN2019218043495, titled "ANTENNA PACKAGING STRUCTURE AND METHOD FOR FORMING THE SAME", filed with CNIPA on Oct. 25, 2019, the disclosure of both are incorporated herein by reference in its entirety.

FIELD OF TECHNOLOGY

The present disclosure generally relates to electronic devices, in particular, to an antenna packaging structure and a method for forming the same.

BACKGROUND

The advanced developments of science and technology have brought in various high-tech electronic products to improve people's lives, including high-tech electronic devices such as laptop computers, mobile phones, and tablet personal computers. Wireless communication technologies have added tremendous popularity to these electronic products. Thanks to wireless communication technologies, users can access these products from any places and at any times, providing convenience to users.

Antenna in Package (AiP) is a technology that integrates antennas and chips in a single package to achieve system-level wireless functions. AiP technology conforms with the trend of increasing silicon-based semiconductor process integration, and provides a good antenna packaging solution for system-level wireless chips. Therefore, AiP technology has become a necessary technology for 5G (5th Generation) communications and automotive radar chips and receives a great amount of attention. Wafer-level Packaged Antennas technologies (WLP AiP) operate on an entire wafer and fabricate antennas on a plastic encapsulation layer. So Compared with the traditional AiP module, WLP AiP has a higher precision. WLP AiP module is lighter, thinner and smaller in size. In the application of antennas, such as in the application of mobile phone terminals, the antennas transmitting and receiving signals need to be integrated with multiple functional chip modules. One traditional method is to directly fabricate the antennas on the surface of a circuit board (PCB), which requires the antennas to occupy additional circuit board area. This method results in long transmission signal lines, poor performance, high power consumption, large package volume, resulting in high transmission loss when transmitting 5g millimeter waves, therefore questionable protection for chips.

SUMMARY

The present disclosure provides a method for packaging antennas, which includes: forming a temporary bonding layer on a supporting substrate; forming a rewiring layer on the temporary bonding layer, the rewiring layer including a first surface connected to the temporary bonding layer, and a second surface opposite to the first surface; fabricating a first antenna layer on the second surface, with the first antenna layer electrically connected to the rewiring layer; fabricating first metal feedline pillars on the first antenna layer, with the first metal feedline pillars electrically connected to the first antenna layer; encapsulating the first metal feedline pillars with a first packaging layer, with top surfaces of the first metal feedline pillars exposed on the first packaging layer; fabricating a second antenna layer on the first packaging layer, with the second antenna layer electrically connected to the first metal feedline pillars; fabricating second metal feedline pillars on the second antenna layer, with the second metal feedline pillars electrically connected to the second antenna layer; encapsulating the second feedline pillars with a second packaging layer, with top surfaces of the second feedline pillars exposed on the second packaging layer; fabricating a third antenna layer on the second packaging layer, with the third antenna layer electrically connected to the second feedline pillars; peeling the temporary bonding layer off from the rewiring layer and the supporting substrate, to expose the first surface of the rewiring layer; forming a first opening on the first surface in the rewiring layer; fabricating one or more semiconductor chips on the first surface, with the one or more semiconductor chips electrically connected to the rewiring layer; forming a metal bump in the first opening, with the metal bump electrically connected to the rewiring layer; encapsulating the one or more semiconductor chips and the meta bump using a third packaging layer; and forming a second opening in the third packaging layer, with the metal bump exposed by the second opening.

The present disclosure also provides an antenna packaging structure, which includes a supporting substrate, a rewiring layer on the supporting substrate, a first antenna layer on the rewiring layer, first metal feedline pillars on the first antenna layer, a first packaging layer covering the first metal feedline pillars except exposing the top surfaces of the first metal feedline pillars, a second antenna layer on the first packaging layer, second metal feedline pillars, a second packaging layer covering the second metal feedline pillars except exposing the top surfaces of the second metal feedline pillars, a third antenna layer on the second packaging layer, semiconductor chips connected to the rewiring layer, a metal bump inside an opening in the rewiring layer, and a third packaging layer encapsulating the semiconductor chips and the metal bump.

DETAILED DESCRIPTION

One or more specific embodiments of the present disclosure will be described below. These described embodiments are only examples of the presently disclosed techniques, and are not intended to limit aspects of the presently disclosed invention. Additionally, in an effort to provide a concise description of these embodiments, all features of an actual implementation may not be described in the specification. It should be appreciated that in the development of any such actual implementation, numerous implementation-specific decisions must be made to achieve the developers' specific goals, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The term regarding spatial relationships such as "lower," "below," "under," and "on," "above," etc., are used for convenience of description to describe the relationship of one element or feature to another element or feature in a figure. It should be understood that in addition to the orientation shown in the figure, the spatial relationship terms are intended to include different orientations during use and operation. In addition, when a layer is referred to as being "between" two layers, it may be the only layer between the two layers, or one of a plurality of layers between the two layers.

In the context of this application, when a first feature is "above" a second feature, the two features may be in direct or indirect contact with each other.

Herein embodiments of the present invention and intermediate structures are illustrated using schematic diagrams or cross-sectional diagrams. Thus, variations in shapes can be expected as manufacturing techniques and/or tolerances may vary. Thus, embodiments of the present invention should not be limited to the particular shapes of regions illustrated, but includes the shapes that result, for example, from manufacturing deviations. For example, an implanted region shown as a rectangle at its edges in a drawing can also have rounded or curved features and/or a gradient of implant concentration, rather than a binary change from implanted to non-implanted regions. Similarly, a buried region formed by implantation may result in the injection being present in the intermediate regions between the buried region and the surface. Thus, the shapes in the figure are illustrative in nature and are not intended to restrict the actual shape of the region and not intended to limit the scope of the invention.

Figure 1:
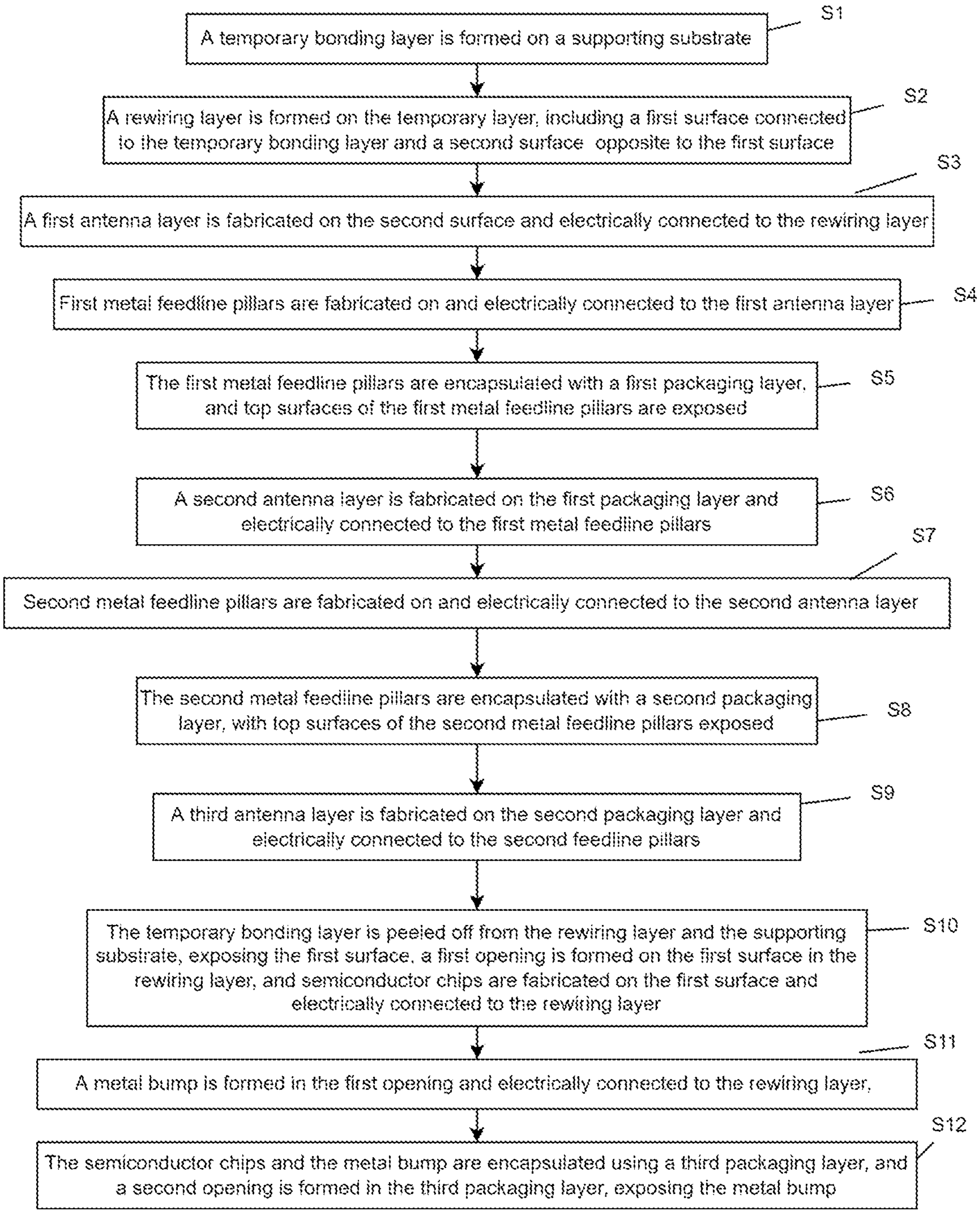
FIG. 1 shows a flowchart illustrating a method of packaging antennas according to some embodiments.

FIG. 1 shows a flowchart illustrating the method or process of packaging antennas according to some embodiments of the disclosure. The described process sets forth various functional blocks or actions that may be described as processing steps, functional operations, events, and/or acts, as illustrated by one or more of the blocks in FIG. 1. The various blocks may be performed by machine, hardware, software, or a combination thereof. The functions performed in all described processes and methods may be implemented in a differing order. Furthermore, the outlined steps and operations are only provided as examples, and some of the steps and operations may be optional, combined into fewer steps and operations, or expanded into additional steps and operations without detracting from the essence of the disclosed embodiments. Also, one or more of the outlined steps and operations may be performed in parallel. In FIG. 1, at S1, the method may form a temporary bonding layer on a supporting substrate; at S2, the method may form a rewiring layer on the temporary bonding layer, the rewiring layer including a first surface connected to the temporary bonding layer, and a second surface opposite to the first surface;

at S3, the method may fabricate a first antenna layer on the second surface, with the first antenna layer electrically connected to the rewiring layer; at S4, the method may fabricate first metal feedline pillars on the first antenna layer, with the first metal feedline pillars electrically connected to the first antenna layer; at S5, the method may encapsulate the first metal feedline pillars with a first packaging layer, with top surfaces of the first metal feedline pillars exposed on the first packaging layer; at S6, the method may fabricate a second antenna layer on the first packaging layer, with the second antenna layer electrically connected to the first metal feedline pillars; at S7, the method may fabricate second metal feedline pillars on the second antenna layer, with the second metal feedline pillars electrically connected to the second antenna layer; at S8, the method may encapsulate the second feedline pillars with a second packaging layer, with top surfaces of the second feedline pillars exposed on the second packaging layer; at S9, the method may fabricate a third antenna layer on the second packaging layer, with the third antenna layer electrically connected to the second feedline pillars; at S10, the method may peel the temporary bonding layer off from the rewiring layer and the supporting substrate, to expose the first surface of the rewiring layer, form a first opening on the first surface in the rewiring layer, and fabricate one or more semiconductor chips on the first surface, with the one or more semiconductor chips electrically connected to the rewiring layer; at S11, the method may form a metal bump in the first opening, with the metal bump electrically connected to the rewiring layer; at S12, the method may encapsulate the one or more semiconductor chips and the meta bump using a third packaging layer, and form a second opening in the third packaging layer, with the metal bump exposed by the second opening.

FIGS. 2-23 illustrate step-by-step the method of packaging antennas as described in FIG. 1 in greater details.

Figure 2:
FIG. 2 is a cross-sectional view after forming a temporary bonding layer according to some embodiments.

Referring to FIG. 2 and S1 in FIG. 1, a supporting substrate 101 is provided and a temporary bonding layer 102 is formed on the supporting substrate.

In some embodiments, the supporting substrate 101 may be a glass substrate, a metal substrate, a semiconductor substrate, a polymer substrate, or a ceramic substrate. In FIG. 2, the supporting substrate 101 is a glass substrate as an example. Glass has a low cost, is easy to form a separation layer on its surface, and can facilitate subsequent peeling processes.

Figure 17:
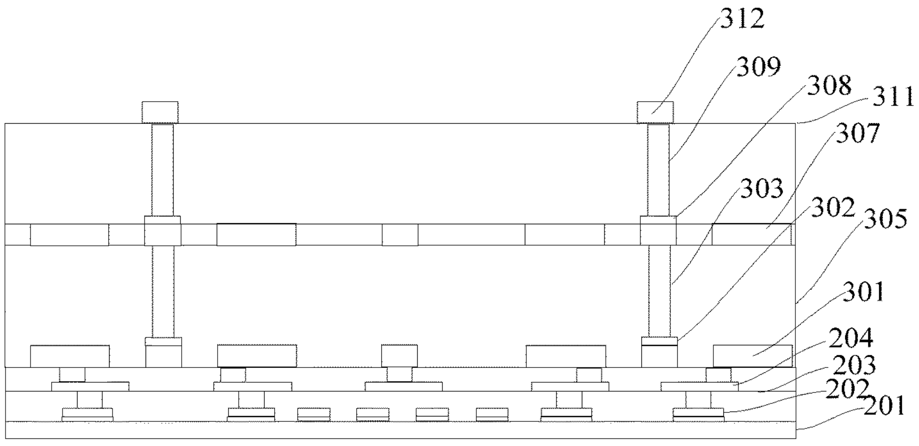
FIG. 17 is a cross-sectional view of a method of removing a substrate according to some embodiments.

In some embodiments, the temporary bonding layer 102 includes a light-to-heat conversion layer. As shown in FIG. 17, in a subsequent operation of some embodiments, the light-to-heat conversion layer is irradiated with a laser to be separated from a rewiring layer and the supporting substrate 101. In other words, the light-to-heat conversion layer can be peeled off from the rewiring layer and the supporting substrate 101. In some embodiments, the light-to-heat conversion layer is formed on the support substrate 101 by a spin coating process, and then cured and molded by a curing process. In some embodiments, the light-to-heat conversion layer has stable performance and a smooth surface, which facilitates fabrication of another layer on it, and makes the subsequent peeling process easier. In addition, after the rewiring layer and the supporting substrate 101 are peeled off, the supporting substrate 101 is able to be reused.

Operation step S2 in FIG. 1 and FIGS. 3-6 illustrates the resulting structures after forming a rewiring layer on the temporary bonding layer 102. The rewiring layer includes a first surface connected to the temporary bonding layer 102 and a second surface opposite to the first surface.

Figure 3:
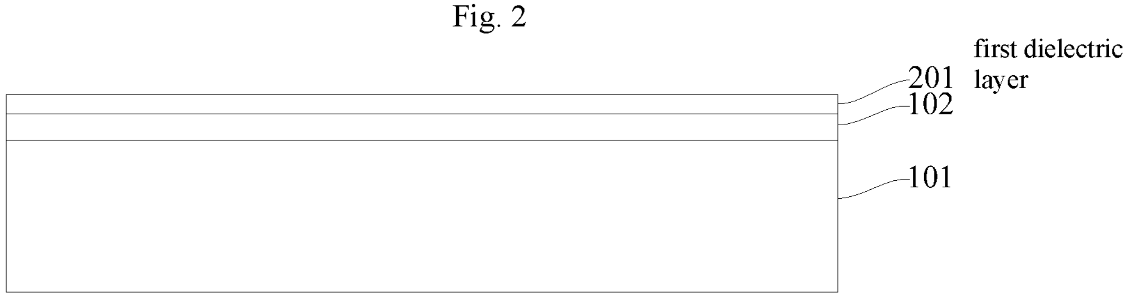
FIG. 3 is a cross-sectional view of after forming a first dielectric layer according to some embodiments.

In some embodiments, the rewiring layer is formed by the following process as illustrated by FIGS. 3-6:

As shown in FIG. 3, a first dielectric layer 201 is formed on the surface of the temporary bonding layer 102 using a chemical vapor deposition process or a physical vapor deposition process. The first dielectric layer 201 is made of one or more of epoxy, silica gel, polyimide, PBO, BCB, silicon oxide, phosphosilicate glass, and fluorine-containing glass. In some embodiments, the first dielectric layer 201 is made of polyimide, which facilitates the process and reduces manufacturing cost.

Figure 4:
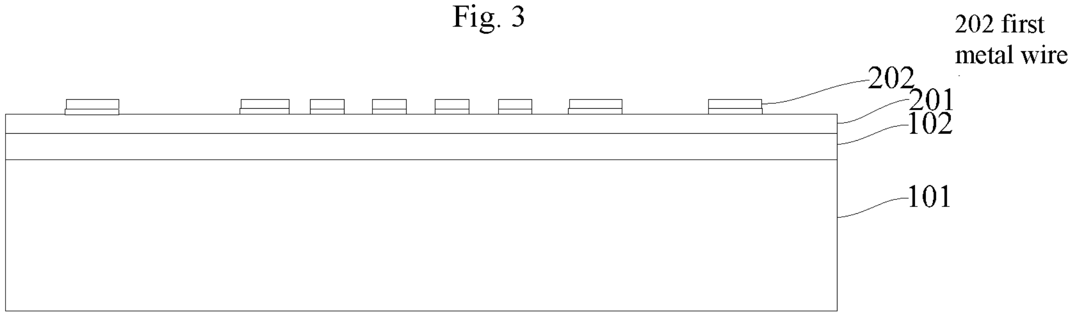
FIG. 4 is a cross-sectional view after forming a first metal wiring layer according to some embodiments.

Next, as shown in FIG. 4, a sputtering process is used to form a seeding layer on the surface of the first dielectric layer 201. Afterward, a first metal layer is formed on the seeding layer, and the first metal layer and the seed layer are etched and patterned to form a first metal wiring layer 202. In some embodiments, the material of the seeding layer includes a stack of a titanium layer and a copper layer. In some embodiments, the material of the first metal wiring layer 202 includes one or more of copper, aluminum, nickel, gold, silver, and titanium.

Figure 5:
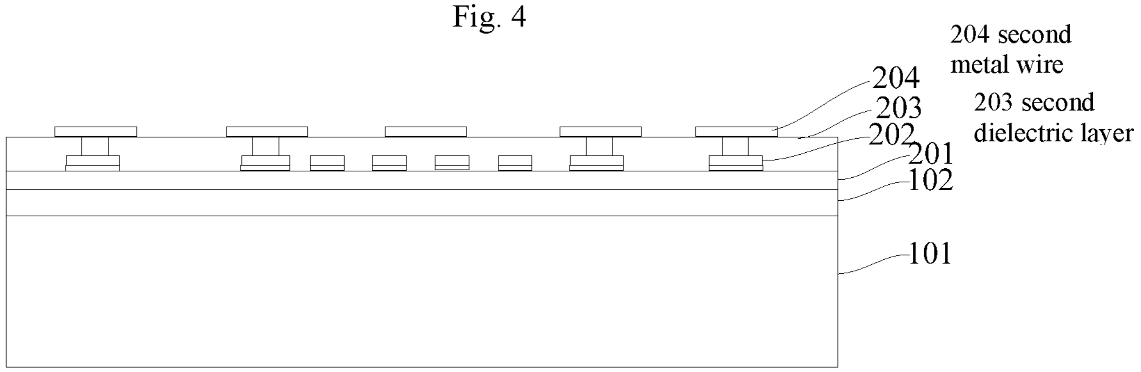
FIG. 5 is a cross-sectional view after forming a second dielectric layer and a second metal wiring layer according to some embodiments.

Next, referring to FIG. 5, a second dielectric layer 203 is formed on the surface of the first metal wiring layer 202 by a chemical vapor deposition process or a physical vapor deposition process, and the second dielectric layer 203 is etched and patterned with through-holes. In some embodiments, the second dielectric layer 203 is made of one or more of epoxy, silica gel, PI, PBO, BCB, silicon oxide, phosphosilicate glass, and fluorine-containing glass. In some embodiments, the material of the second dielectric layer 203 is PI (polyimide), which facilitates the process and reduces manufacturing cost.

Still referring to FIG. 5, conductive plugs are filled in the through-holes, and then a second metal layer is formed on the surface of the second dielectric layer 203 by a sputtering process. A second metal wiring layer 204 is formed by etching and patterning the second metal layer. In some embodiments, the second metal wiring layer 204 is made of one or more of copper, aluminum, nickel, gold, silver, and titanium.

Figure 6:
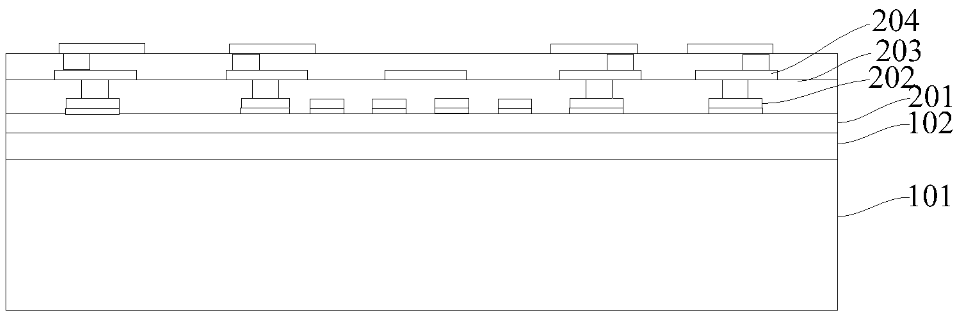
FIG. 6 is a cross-sectional view after forming a rewiring layer with a multiple-layer structure according to some embodiments.

In some embodiments, as shown in FIG. 6, the process illustrated in FIG. 5 is repeated to form a multi-layer metal layer and a multi-layer dielectric layer, thereby forming a rewiring layer with a multi-layer stack structure to achieve multiple wiring functions.

Figure 7:
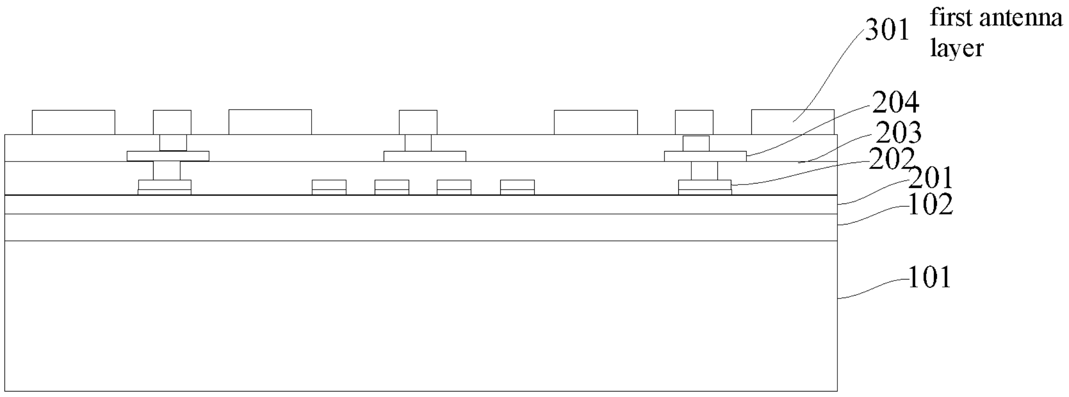
FIG. 7 is a cross-sectional view after forming a first antenna layer according to some embodiments.

As shown in FIG. 7 and S3 in FIG. 1, a first antenna layer 301 electrically connected to the rewiring layer is formed on the second surface. The first antenna layer 301 is made of materials including copper.

Figure 11:
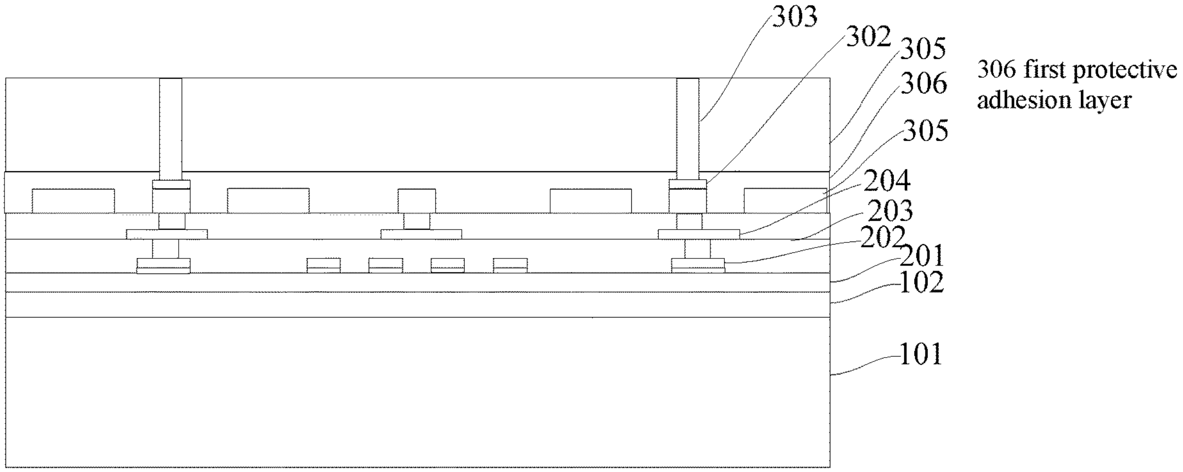
FIG. 11 is a cross-sectional view after forming a first protective adhesive layer according to some embodiments.

In some embodiments, as shown in FIG. 11, after forming the first antenna layer 301, the method for packaging antennas further includes: forming a first protective adhesive layer 306 covering the first antenna layer 301 on the rewiring layer, forming first metal feedline pillars 303 on a surface of the first antenna layer 301, with the first metal feedline pillars extending through the first protective adhesive layer 306, and forming a first packaging layer 305 on the first protective adhesive layer 306.

In some embodiments, the first protective adhesive layer 306 is made of polyimide. Since two adjacent layers of antenna structures in some embodiments are separated by one antenna layer, the adhesion strength between the two layers of antenna structures tends to decrease and cause displacement or breakage. Therefore, in some embodiments, a protective adhesive layer is formed between the two layers of antenna structures. The first protective adhesive layer 306 as illustrated in FIG. 11, on the one hand, can protect the metal part of the antenna. On the other hand, it can increase the adhesion between the two antenna layers, and improve the mechanical structure strength of the antenna.

Figure 8:
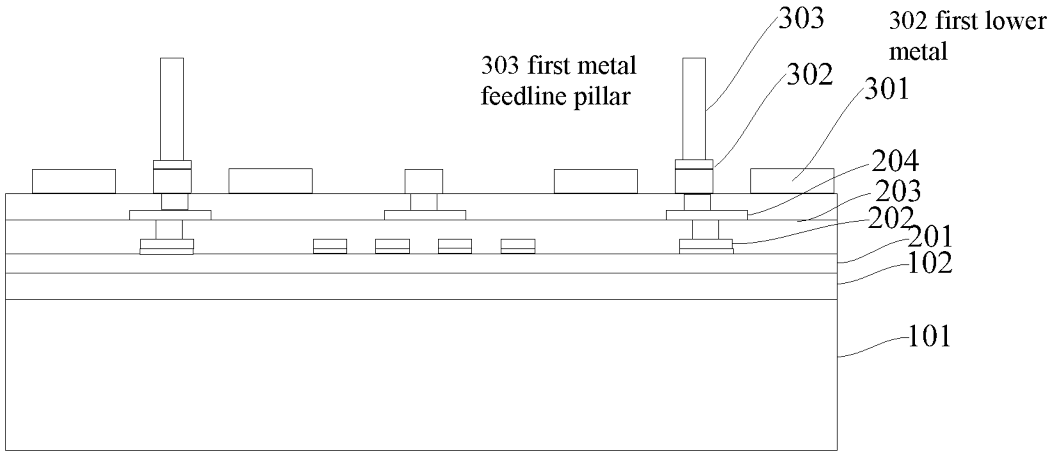
FIG. 8 is a cross-sectional view after forming first metal feedline pillars according to some embodiments.

As shown in FIG. 8 and step S4 of FIG. 1, the first metal feedline pillars 303 are formed on the first antenna layer 301, and the first metal feedline pillars 303 are electrically connected to the first antenna layer 301.

In some embodiments, before forming the first metal feedline pillars 303, a first lower metal layer 302 is formed on the surface of the first antenna layer 301, and the first metal feedline pillars 303 are formed on the first lower metal layer 302. On a surface of the first lower metal layer 302, in some embodiments, the first metal feedline pillars 303 are formed by a wire bonding process, an electroplating process, or an electroless plating process.

More specifically, in some embodiments, the first lower metal layer 302 includes a stacked layer composed of a Ni layer and an Au layer. In some embodiments, the first metal feedline pillars 303 are made of one or more of Au, Ag, Cu, Al. In some other embodiments, the first metal feedline pillars 303 are made of a material that is suitable for forming a metal pillar. In some embodiments, a wire bonding process is used to form the first metal feedline pillars 303 on the first lower metal layer 302. The first lower metal layer 302 strengthens the bonding strength of the first metal feedline pillars 303 and the first antenna layer 301, and reduces the contact resistance between first metal feedline pillars 303 and the first antenna layer 301. In some other embodiments, when the first protective adhesive layer 306 is present, the method for packaging antennas further includes forming an opening in the first protective adhesive layer 306 to expose one of the first metal feedline pillars 303.

In some embodiments, there are multiple first metal feedline pillars 303. In some embodiments, an electromagnetic shielding structure is also formed above the first metal feedline pillars 303 and the first antenna layer 301, to provide electromagnetic shielding for the package structure.

In some embodiments, the first metal feedline pillars 303 are formed a surface of the first antenna layer 301, and the first metal feedline pillars 303 are so distributed that the first metal feedline pillars 303 and one or more metal parts of the first antenna layer 301 form an electromagnetic shielding structure, to provide electromagnetic shielding for the package structure.

Figure 9:
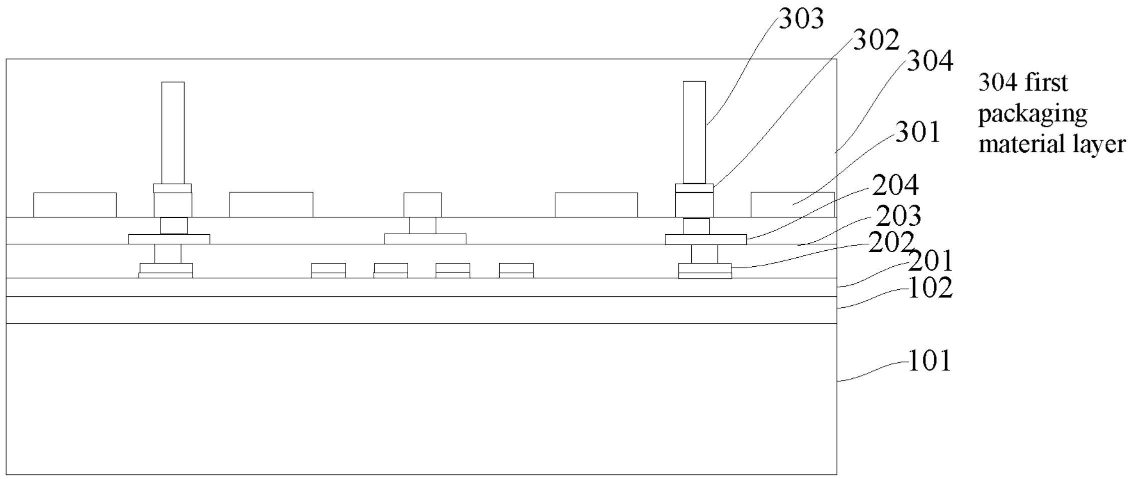
FIG. 9 is a cross-sectional view after forming a first packaging material layer according to some embodiments.
Figure 10:
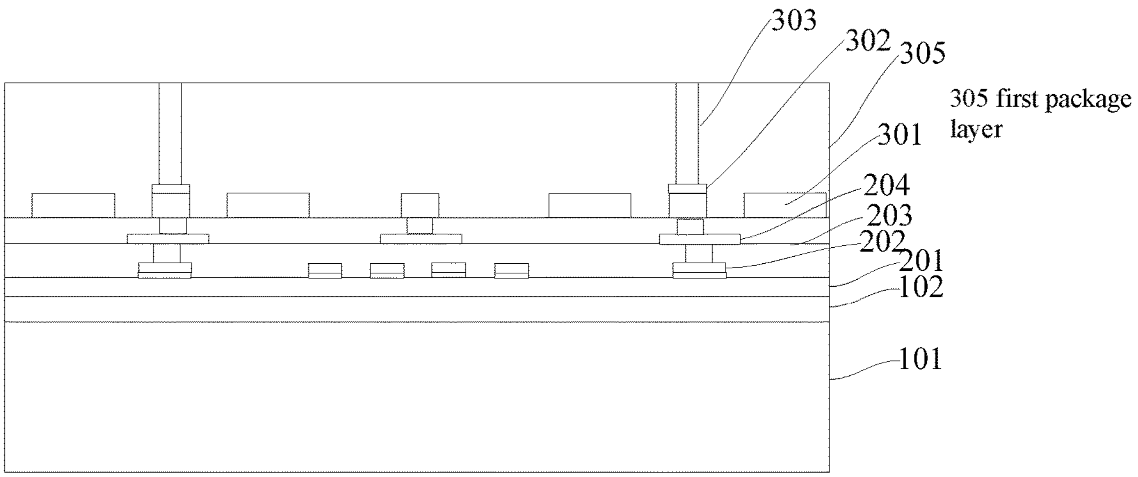
FIG. 10 is a cross-sectional view after forming a first packaging layer according to some embodiments.

As shown in FIGS. 9-10 and step S5 of FIG. 1, in some embodiments, the first packaging layer 305 encapsulates the first metal feedline pillars 303 with the first metal feedline pillars 303 extending through the first packaging layer 305. That is, top surfaces of the first metal feedline pillars 303 are not covered by the first packaging layer 305. That is, the first metal feedline pillars 303 penetrate the first packaging layer 305.

Specifically, in some embodiments, the first metal feedline pillars 303 are encapsulated by a first packaging material layer 304, and the first packaging material layer 304 is thinned so that the top surfaces of the first metal feedline pillars 303 is exposed, and the thinned first packaging material layer 304 forms the first packaging layer 305. In some embodiments, the first metal feedline pillars 303 are encapsulated by the first packaging material layer 304 by one of compression molding, transfer molding, liquid-sealing molding, vacuum lamination, and spin coating. The first packaging layer 305 is made of one of silica gel and epoxy. As shown in FIG. 11, when the first protective adhesive layer 306 is present, the first packaging layer 305 is formed on the first protective adhesive layer 306.

Figure 12:
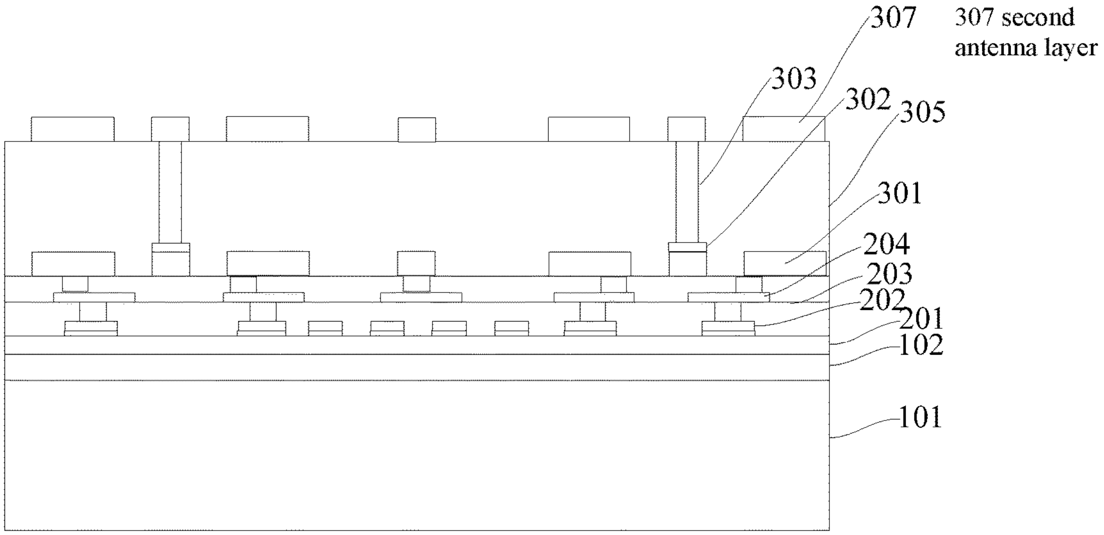
FIG. 12 is a cross-sectional view after forming a second antenna layer according to some embodiments.

As shown in FIG. 12 and step S6 of FIG. 1, a second antenna layer 307 is formed on the first packaging layer 305 and electrically connected to the first metal feedline pillars 303. Specifically, the material of the second antenna layer 307 may be copper.

Figure 16:
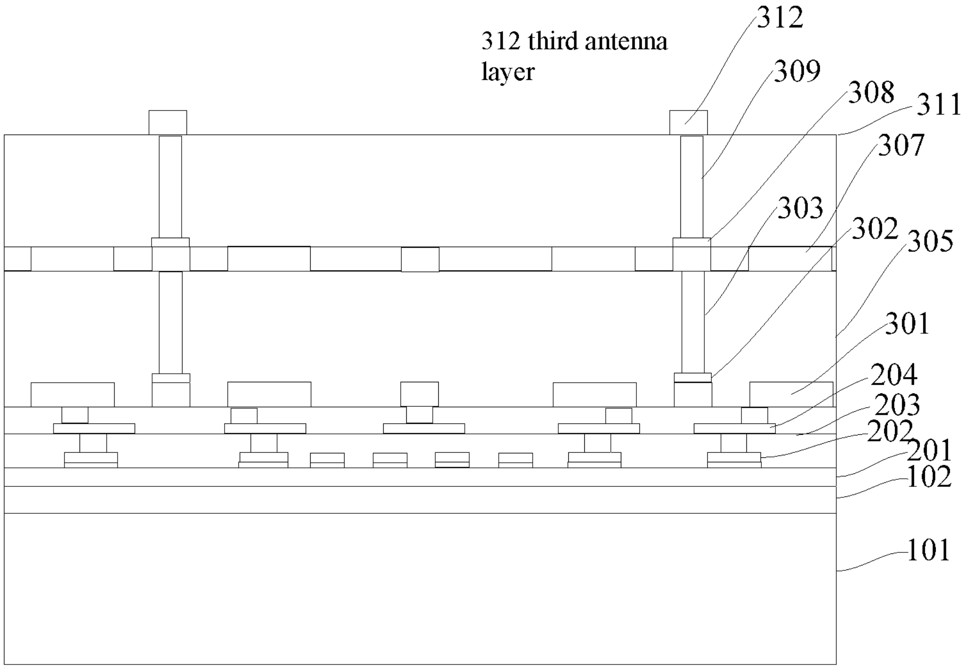
FIG. 16 is a cross-sectional view after forming a third antenna layer according to some embodiments.

In an embodiment, as shown in FIG. 16, a dielectric layer (not shown?) is formed surrounding the second antenna layer 307. The dielectric layer is made of PI (polyimide) in some embodiments.

In some embodiments, a top surface of the dielectric layer is even at the same plane as the top surface of the second antenna layer 307, a second packaging layer 311 is then formed on the top surfaces of the dielectric layer and the second antenna layer 307. The second antenna layer 307 and the first antenna layer 301 are electrically connected by the first metal feedline pillars 303. This a multi-layer antenna has better reception, higher receiver bandwidth, better electrical properties, antenna efficiency, shortened conduction paths between components, and lower power consumption.

In some embodiments, after forming the second antenna layer 307, the method for packaging antennas further includes forming a second protective adhesive layer covering the second antenna layer 307 on the first packaging layer 305, and the second metal feedline pillars 309 are formed on a surface of the second antenna layer 307 extending through the second protective adhesive layer. The second packaging layer 311 is subsequently formed on the second protective adhesive layer. In an embodiment, the second protective adhesion layer is made of polyimide. Since two adjacent layers of antenna structures in some embodiments are separated by one antenna layer, the adhesion quality between the two layers of antenna structures tends to degrade with time which causes displacement or breakage. Therefore, in some embodiments, a protective adhesive layer is formed between the two layers of antenna structures. The first protective adhesive layer 306 as illustrated in FIG. 11, on the one hand, can protect the metal part of the antenna. On the other hand, it can increase the adhesion between the two antenna layers, and improve the mechanical structure strength of the antennas.

In some embodiments, the packaging structure includes only one of the first protective adhesive layer 306 and the second protective adhesive layer. In some other embodiments, the packaging structure includes both the first protective adhesive layer and the second protective adhesive layer.

Figure 13:
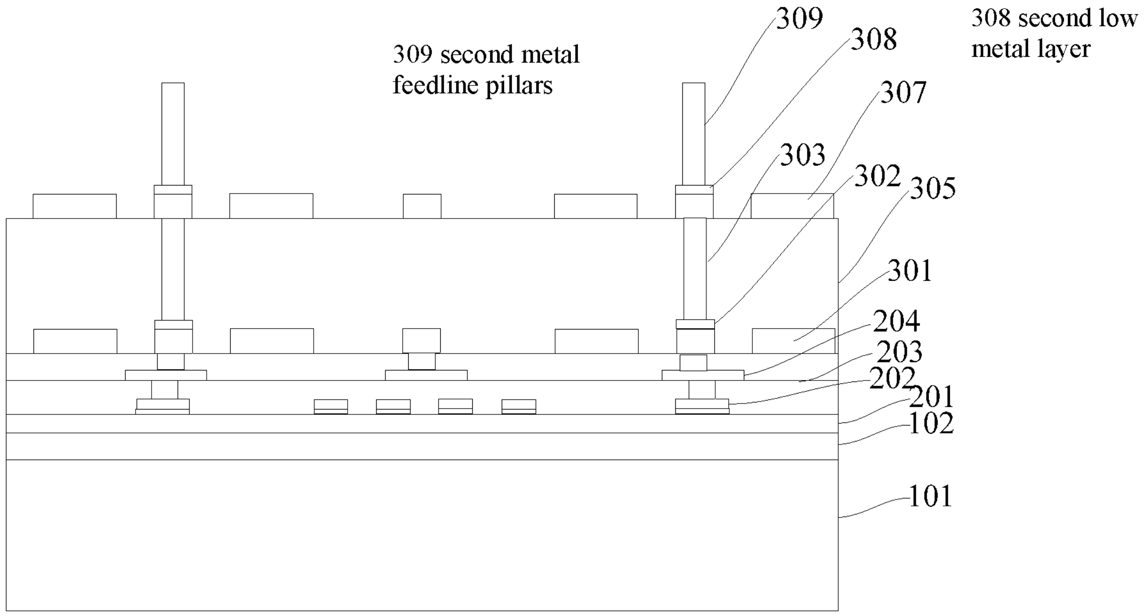
FIG. 13 is a cross-sectional view after forming second feedline pillars according to some embodiments.

As shown FIG. 13 and S7 of FIG. 1, second metal feedline pillars 309 are formed on the second antenna layer 307 and electrically connected to the second antenna layer 307. In some embodiments, the distribution of the second metal feedline pillars 309 corresponds to the distribution of the first metal feedline pillars 303.

In some embodiments, before the second metal feedline pillars 309 are formed, a second lower metal layer 308 is formed on a surface of the second antenna layer 307, and then the second metal feedline pillars 309 are formed on the first antenna layer. On a surface of the second lower metal layer 308, in some embodiments, the second metal feedline pillars 309 are formed by a wire bonding process, an electroplating process, or an electroless plating process.

Specifically, the second lower metal layer 308 includes a stacked layer composed of a Ni layer and an Au layer. The second metal feedline pillars 309 are made of one of Au, Ag, Cu, and Al, In some other embodiments, the second metal feedline pillars are made of a material that is suitable for forming a metal pillar. In some embodiments, a wire bonding process is used to form the second metal feedline pillars 309 on the second lower metal layer 308.

The second lower metal layer 308 strengthens the bonding strength of the second metal feedline pillars 309 and the second antenna layer 307, and reduces the contact resistance between second metal feedline pillars 309 and the second antenna layer 307. In some other embodiments, when the second protective adhesive layer is present, the method for packaging antennas further includes forming an opening in the second protective adhesive layer to expose one of the second metal feedline pillars 309.

In some embodiments, there are multiple second metal feedline pillars 309. In some embodiments, an electromagnetic shielding structure is also formed above the second metal feedline pillars 309 and the second antenna layer 307, to provide electromagnetic shielding for the package structure.

Figure 14:
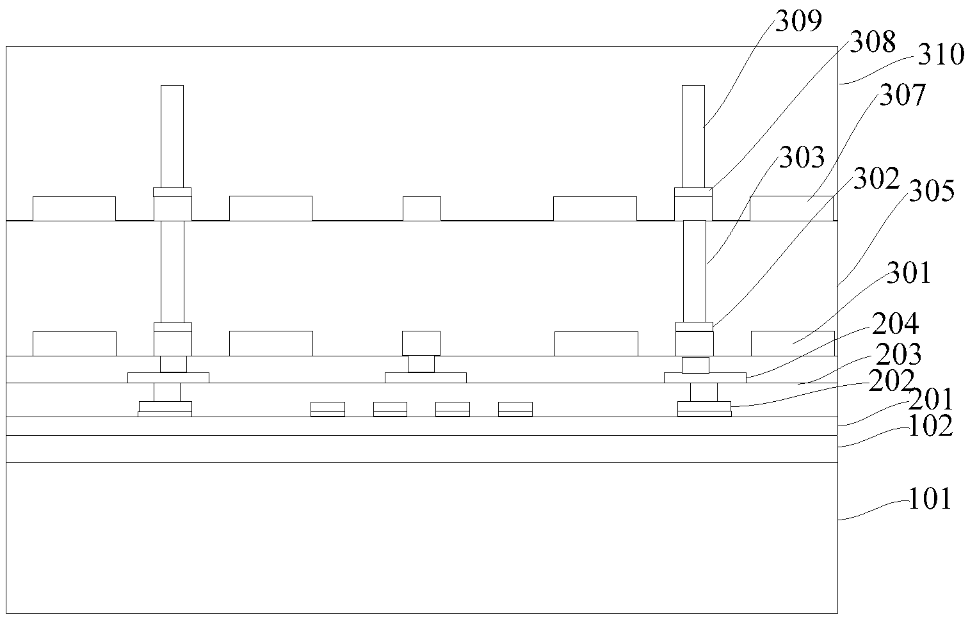
FIG. 14 is a cross-sectional view after forming a second packaging material layer according to some embodiments.
Figure 13:
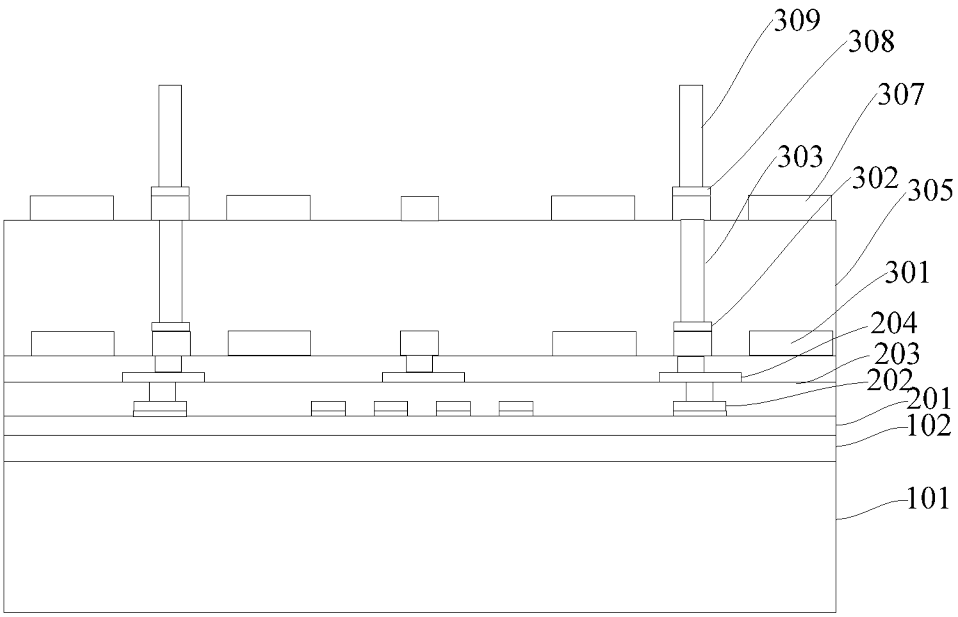
Figure 14:
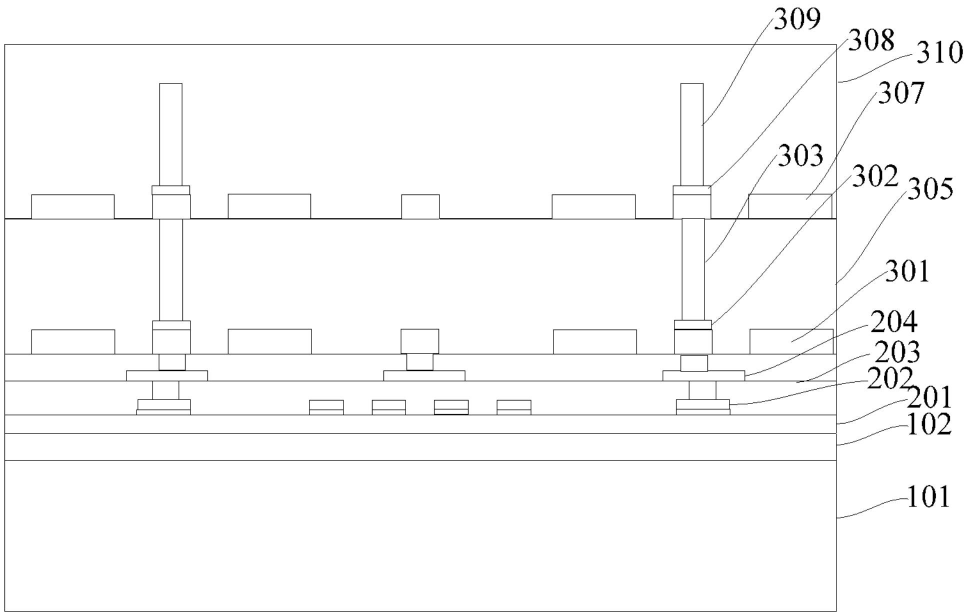
Figure 15:
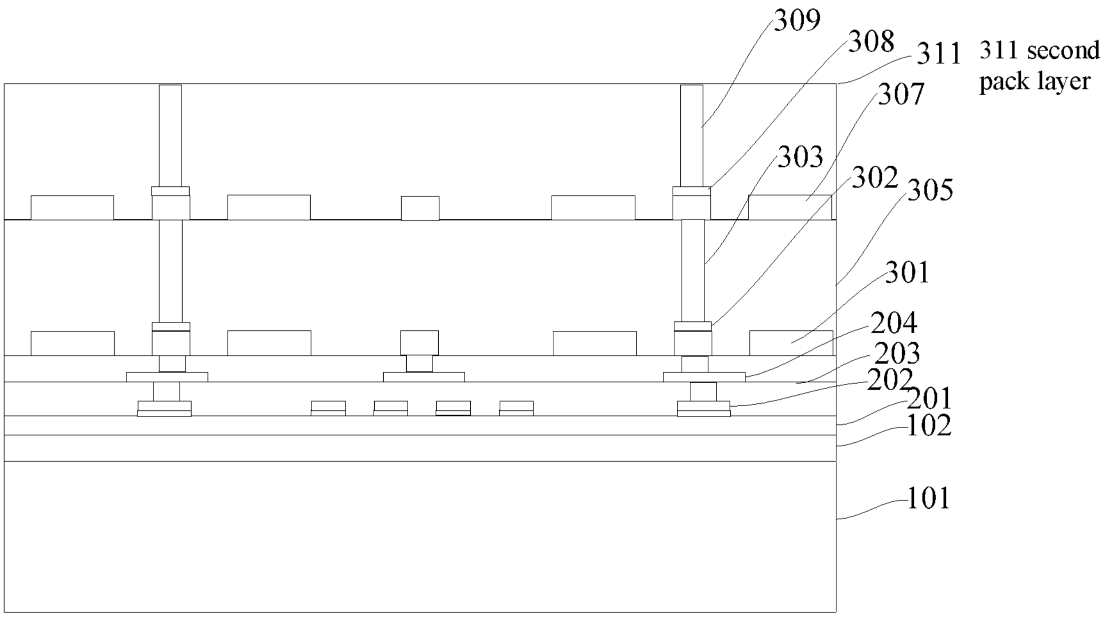
FIG. 15 is a cross-sectional view after forming a packaging layer according to some embodiments.

As shown in FIGS. 14-15 and S8 of FIG. 1, in some embodiments, the second packaging layer 311 encapsulates the second metal feedline pillars 309 with the second metal feedline pillars 309 extending through the second packaging layer 311. That is, top surfaces of the second metal feedline pillars 309 are not covered by the second packaging layer 311. That is, the second metal feedline pillars 309 penetrate the second packaging layer 311.

Specifically, in some embodiments, the second metal feedline pillars 309 are encapsulated by a second packaging material layer 310, and the second packaging material layer 310 is thinned so that the top surfaces of the second metal feedline pillars 309 is exposed, and the thinned second packaging material layer 310 forms the second packaging layer 311. In some embodiments, the second metal feedline pillars 309 are encapsulated by the second packaging material layer 310 by one of compression molding, transfer molding, liquid-sealing molding, vacuum lamination, and spin coating. The second packaging layer 311 is made of one of silica gel and epoxy. As shown in When the second protective adhesive layer is present, the second packaging layer 311 is formed on the second protective adhesive layer.

As shown in FIG. 16 and step S9 of FIG. 1, a third antenna layer 312 is formed on the second packaging layer 311 and electrically connected to the second metal feedline pillars 309. Specifically, the material of the third antenna layer 312 may be copper. The third antenna layer 312 is electrically connected to the second antenna layer 307 through the second metal feedline pillars 309.

Figure 18:
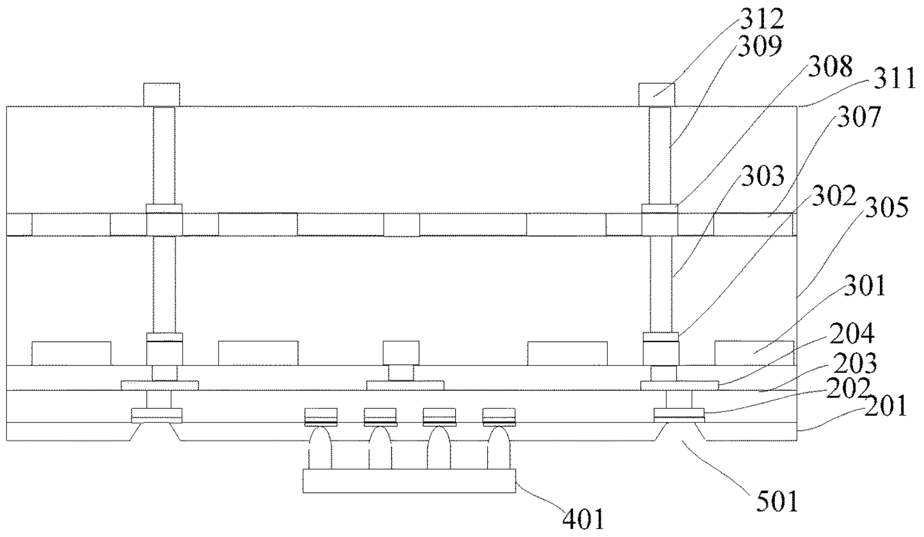
FIG. 18 is a cross-sectional view after deposing semiconductor chips and forming a first opening according to some embodiments.

As shown in FIGS. 17-18 and step S10 of FIG. 1, the temporary bonding layer 102 is peeled off together with the supporting substrate 101 from the rewiring layer (it's a stack of metal and dielectric layer structure), with the first surface of the rewiring layer exposed, a first opening 501 is formed on the first surface in the rewiring layer, one or more semiconductor chips 401 are attached to the first surface, with the semiconductor chips electrically connected to the rewiring layer. In some embodiments, the semiconductor chips 401 are formed by bonding, and are preliminary fixed to a wafer through reflow soldering after die bonding.

More specifically, in some embodiments, laser light is used to irradiate the light-to-heat conversion layer to separate the light-to-heat conversion layer from the rewiring layer and the supporting substrate 101. In addition, after separation, the first surface of the rewiring layer can be punched to form the first opening 501, which can be achieved by laser drilling technology. The first opening 501 reveals metal leads in the rewiring layer. The first opening 501 defines the position where a metal bumps is formed subsequently. In one embodiment, the first opening 501 is formed first, and then the semiconductor chips 401 are formed on the first surface of the rewiring layer in order to protect the semiconductor chips 401. In some embodiments, there is a gap between the first opening 501 and the semiconductor chips 401.

In some embodiments, the number of the semiconductor chips 401 is more than one, and the semiconductor chips are made of either active components or passive components. The active components can be one of a power management circuit, a transmitting circuit, and a receiving circuit. The passive components can be one of resistance, capacitance and inductance.

Figure 19:
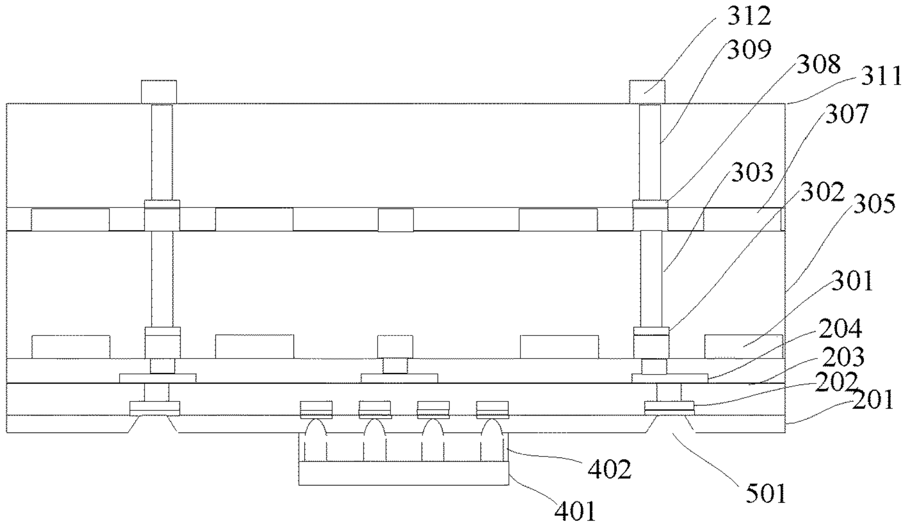
FIG. 19 is a cross-sectional view after forming an underfill layer according to some embodiments.
Figure 20:
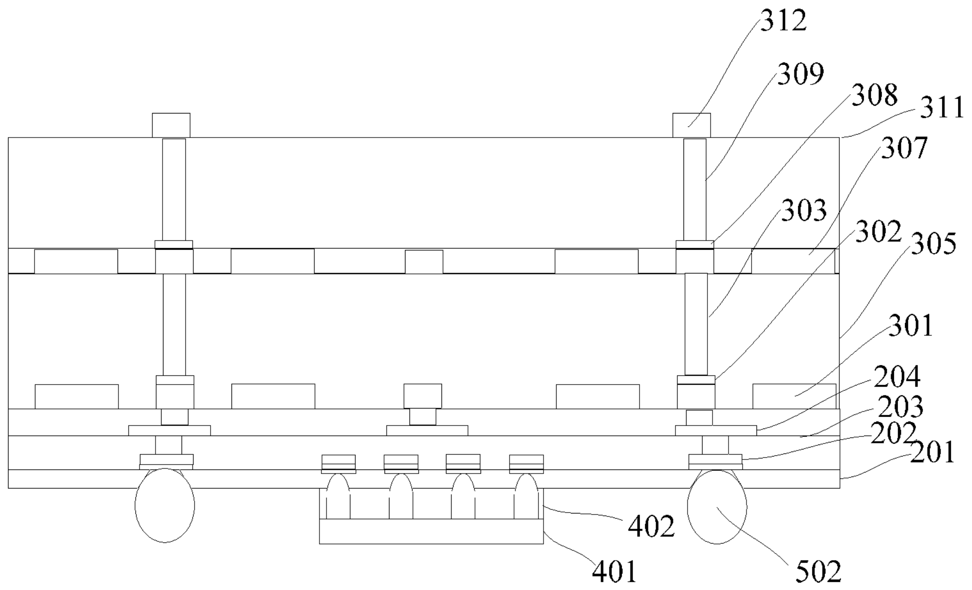
FIG. 20 is a cross-sectional view after forming metal bumps according to some embodiments.
Figure 21:
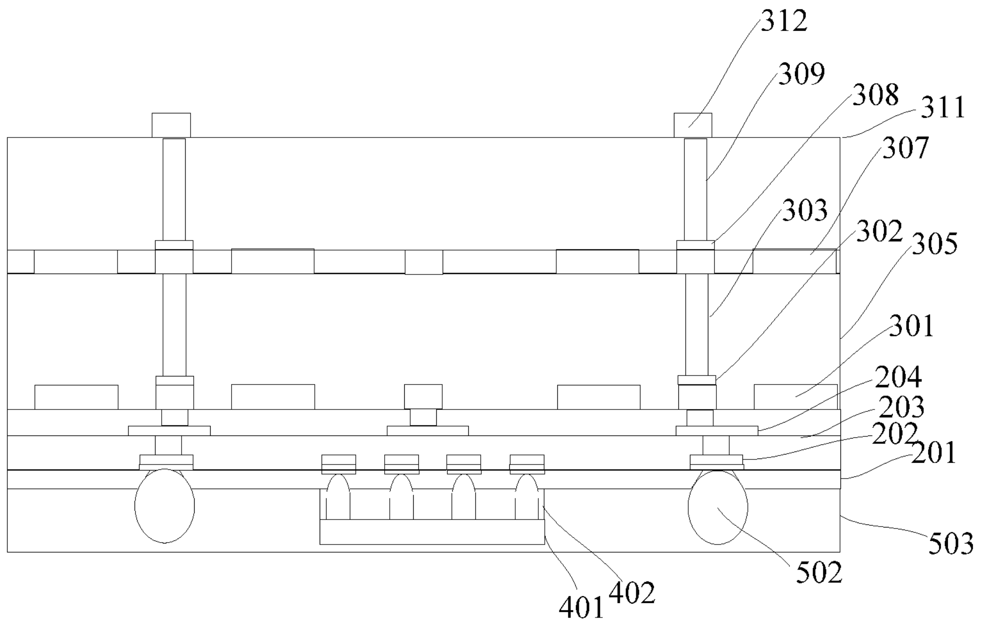
FIG. 21 is a cross-sectional view after forming a third packaging layer on the chip side according to some embodiments.

As shown in FIGS. 19-20 and step S11 of FIG. 1, metal bumps 502 electrically connected to the rewiring layer are formed in the first openings 501. In some embodiments, after the semiconductor chips 401 are formed and before the metal bumps 502 are formed, each of the semiconductor chips 401 is under filled, an under-fill layer 402 forming within the chip area.

Specifically, the metal bumps 502 are preliminarily fixed in the first openings 501. The metal bumps 502 may be made of one of tin solder, silver solder, and gold-tin alloy solder. The solder ball is preliminarily fixed on the rewiring layer through reflow soldering after ball mounting, In addition, in an embodiment, the semiconductor chips 401 are under-filled before the metal bumps 502 is formed. Such an order helps to prevent the metal bumps 502 from interfering with siphoning of the under-filling process. The material used for the under-filling may be epoxy. The under-filling is achieved with the help of the siphon effect. Filler used in the under-filling is siphoned into the gap between the semiconductor chips 401 and the rewiring layer. The metal bumps 502 could also cause the siphon effect, which is the reason the metal bumps 502 is formed after the under-filling in some embodiments.

Figure 22:
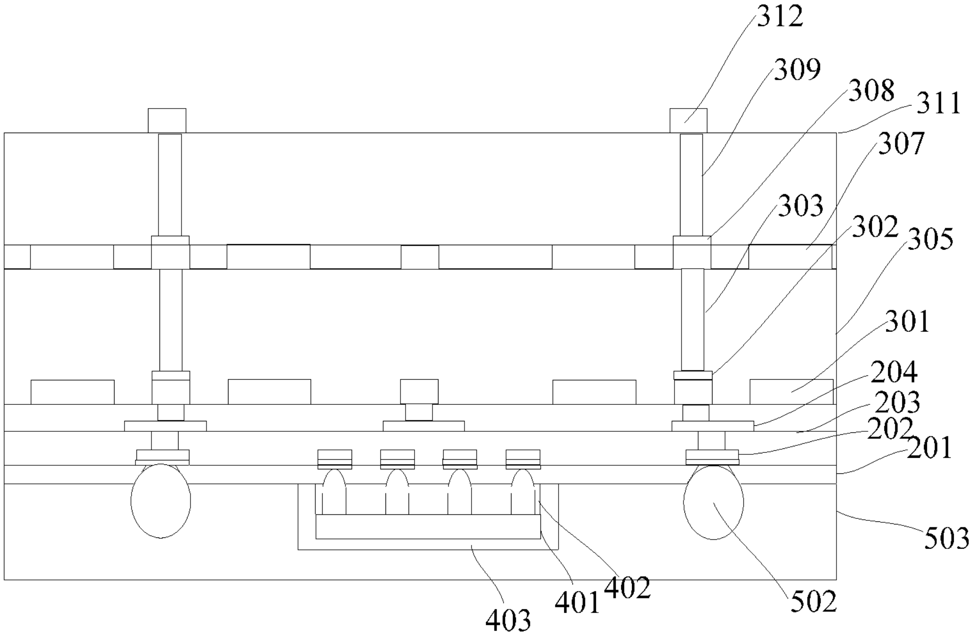
FIG. 22 is a cross-sectional view of an antenna packaging structure with a dam & fill protective layer according to some embodiments.

In some embodiments, after the under-fill layer 402 is formed, a dam & fill protective layer 403, as shown in FIG. 22. The dam & fill protective layer 403 is formed at least at the bottom and on the sides of the semiconductor chips 401. Together, the dam dispensing protective layer 403 and the under-fill layer 402 surround the semiconductor chips 401.

More specially, the dam & fill protective layer 403 is formed after the semiconductor chips 401 are attached to the first surface; the dam & fill protective layer 403 is formed by first forming a dam around the semiconductor chips 401 using glue, and then dispensing glue in the area surrounded by the dam. In some embodiments, the dam & fill protective layer 403 increases the stability of the semiconductor chips 401, and offers more protection for the semiconductor chips 401. In some embodiments, the dam & fill protective layer 403 is formed after the under-filing process, and the dam & fill protective layer 403 together with the under-fill layer envelops the semiconductor chips 401. In some embodiments, the dam & fill protective layer 403 is made of an epoxy.

As shown in step S12 in FIG. 1 and FIGS. 21-23, the semiconductor chips 401 and the metal bumps 502 are encapsulated by a third packaging layer 503, and a second opening 504 is formed in the third packaging layer 503 to expose the metal bumps 502.

Figure 23:
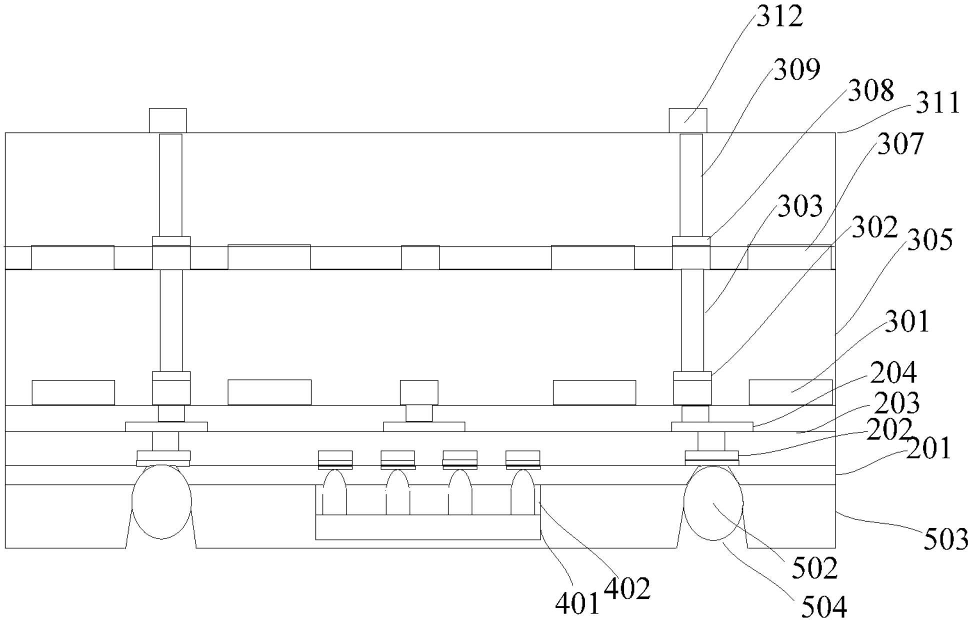
FIG. 23 is a cross-sectional view after forming a second opening on the chip side according to some embodiments.

Specifically, the third packaging layer 503 is formed by compression molding, transfer molding, liquid sealing molding, vacuum lamination, or spin coating. The third packaging layer 503 is made of one of silica gel and epoxy materials. In addition, in some embodiments, a laser is used to drill in the third packaging layer 503 to form the second opening 504. The second opening 504 exposes the metal bumps 502. In some embodiments, as shown in FIG. 23, the second opening 504 is not a through-hole in the third packaging layer 503, saving energy and time in forming the second opening 504. In some embodiments, the metal bumps 502 is fixed to the third packaging layer 503 by molding.

Additionally, when there is a dam & fill protective layer 403, the third packaging layer also encapsulates the dam & fill protective layer 403, which increases the device's stability in some embodiments.

As discussed above, a method for packaging antennas is disclosed herein. The present disclosure further provides an antenna packaging structure corresponding to the method, as shown in FIG. 23 and also partially illustrated in FIGS. 1-22.

In some embodiments, as shown in FIG. 23, the antenna packaging structure includes: a rewiring layer, a first antenna layer 301, first metal feedline pillars 303, a first packaging layer 305, a second antenna layer 307, second metal feedline pillars 309, a second packaging layer 311, a third antenna layer 312, one or more semiconductor chips 401, a metal bumps 502, and a third packaging layer 503.

The rewiring layer includes a first surface and a second surface opposite to the first surface. The rewiring layer also includes a first opening 501 formed on the first surface. The first antenna layer 301 is formed on the second surface and electrically connected to the rewiring layer. The first metal feedline pillars 303 are formed on the first antenna layer 301 and electrically connected to the first antenna layer 301. The first packaging layer 305 covers the first metal feedline pillars 303, and the top surfaces of the first metal feedline pillars 303 are exposed. That is, the first metal feedline pillars 303 penetrate the first packaging layer 305.

The second antenna layer 307 is formed on the first packaging layer 305 and electrically connected to the first metal feedline pillars 303. The second metal feedline pillars 309 are formed on the second antenna layer and electrically connected to the second antenna layer 307. The second packaging layer 311 covers the second metal feedline pillars 303 with top surfaces of the second metal feedline pillars 303 exposed. The third antenna layer 312 is formed on the second packaging layer 311 and electrically connected to the second metal feedline pillars 309. The semiconductor chips 401 are connected to the first surface and electrically connected to the rewiring layer. The metal bumps 502 is formed in the first opening 501 and electrically connected to the rewiring layer. The third packaging layer 503 encapsulates the semiconductor chips 401 and the metal bumps 502, and the third packaging layer 503 includes a second opening 504 exposing the metal bumps 502.

Specifically, in some embodiments, the rewiring layer includes a first dielectric layer 201, a first metal wiring layer 202, a second dielectric layer 203, a conductive plug, and a second metal wiring layer 204. In some embodiments, the rewiring layer has a multi-layer stack structure comprising multiple metal layers and multiple dielectric layers to achieve different wiring functions. In some embodiments, the first dielectric layer 201 and the second dielectric layer 203 are made of one or more of epoxy, silica gel, PI (polyimide), PBO, BCB, silicon oxide, phosphosilicate glass, and fluorine-containing glass. In some embodiments, the first dielectric layer 201 and the second dielectric layer 203 are made of PI (polyimide), which facilitates the process and reduces manufacturing cost.

In some embodiments, the first metal wiring layer 202 and the second metal wiring layer 204 are made of one or more of copper, aluminum, nickel, gold, silver, and titanium.

In some embodiments, the first lower metal layer 302 is formed in a connection area between the first metal feedline pillars 303 and the first antenna layer 301. In one embodiment, the first metal feedline pillars 303 are made of one of gold, silver, copper, and, aluminum. In another embodiment, the first metal feedline pillars 303 are made of a material that is suitable for forming a metal pillar. In some embodiments, the first lower metal layer 302 includes a stacked layer composed of a Ni layer and an Au layer. The first lower metal layer 302 strengthens the bonding strength of the first metal feedline pillars 303 and the first antenna layer 301, and reduces the contact resistance between first metal feedline pillars 303 and the first antenna layer 301.

In some embodiments, the second lower metal layer 308 is formed in a connection area between the second metal feedline pillars 309 and the second antenna layer 307. In one embodiment, the second metal feedline pillars 309 are made of one of gold, silver, copper, and, aluminum. In another embodiment, the second metal feedline pillars 309 are made of a material that is suitable for forming a metal pillar. In some embodiments, the second lower metal layer 308 includes a stacked layer composed of a Ni layer and an Au layer. The second lower metal layer 308 strengthens the bonding strength of the second metal feedline pillars 309 and the second antenna layer 307, and reduces the contact resistance between the second metal feedline pillars 309 and the second antenna layer 307.

Specifically, in some embodiments, the first antenna layer 301 is made of copper. In some embodiments, the second antenna layer 307 is made of copper. In some embodiments, the third antenna layer 312 is made of materials including copper.

The second antenna layer 307 and the first antenna layer 301 are electrically connected through the first metal feedline pillars 303, and the third antenna layer 312 and the second antenna layer 307 are electrically connected through the second metal feedline pillars 309. In some embodiments, such a multi-layer antenna leads to better reception, higher receiver bandwidth, better electrical properties and antenna efficiency, shortened conduction paths between components, and lower power consumption.

In some embodiments, the antenna packaging structure also includes a first protective adhesive layer 306 covering the first antenna layer 301 on the rewiring layer. The first metal feedline pillars 303 are formed on a surface of the first antenna layer 301 and extend through the first protective adhesive layer 306. The first packaging layer 305 is formed on the first protective adhesive layer 306.

In some embodiments, a second protective adhesive layer (not illustrated in FIG. 23) covering the second antenna layer 307 is formed on the first packaging layer 305, and the second metal feedline pillars 309 are formed on a surface of the second antenna layer 307 extending through the second protective adhesive layer. The second packaging layer 311 is formed on the second protective adhesive layer.

Referring to FIG. 11, in some embodiments, the first protective adhesive layer 306 is formed on the rewiring layer, and covers the first antenna layer 301. The first metal feedline pillars are formed on a surface of the first antenna layer 301, and extend through the first protective adhesive layer 306. The first packaging layer is formed on the first protective adhesive layer 306.

In some embodiments, the first protective adhesive layer 306 is made of polyimide. Since two adjacent layers of antenna structures in some embodiments are separated by one antenna layer, the adhesion strength between the two layers of antenna structures tends to decrease and cause displacement or breakage. Therefore, in some embodiments, a protective adhesive layer is formed between the two layers of antenna structures. The first protective adhesive layer 306 as illustrated in FIG. 11, on the one hand, can protect the metal part of the antenna. On the other hand, it can increase the adhesion between the two antenna layers, and improve the mechanical structure strength of the antenna.

The first packaging layer 305 is made of one of silica gel and epoxy. As shown in FIG. 11, when the first protective adhesive layer 306 is present, the first packaging layer 305 is formed on the first protective adhesive layer 306. The second packaging layer 311 is made of one of silica gel and epoxy. When the second protective adhesive layer is present, the second packaging layer 311 is formed on the second protective adhesive layer.

In some embodiments, the number of the semiconductor chips 401 is more than one, and the semiconductor chips are made of either active components or passive components. The active components can be one of a power management circuit, a transmitting circuit, and a receiving circuit. The passive components can be one of resistance, capacitance and inductance. In some embodiments, all passive components and active components are encapsulated in one packaging unit. In some embodiments, both passive components and active components are placed on one wafer.

In some embodiments, there are multiple first metal feedline pillars 303. In some embodiments, an electromagnetic shielding structure is formed by the first metal feedline pillars 303 and the first antenna layer 301.

Specifically, in some embodiments, the first metal feedline pillars 303 are formed a surface of the first antenna layer 301, and the first metal feedline pillars 303 are so distributed that the first metal feedline pillars 303 and one or more metal parts of the first antenna layer 301 form an electromagnetic shielding structure, to provide electromagnetic shielding for the package structure.

In some embodiments, there are multiple second metal feedline pillars 309. In some embodiments, an electromagnetic shielding structure is also formed by the second metal feedline pillars 309 and the second antenna layer 307.

In some embodiments, the antenna packaging structure also includes an under-fill layer 402, which is formed between the semiconductor chips 401 and the rewiring layer.

In some embodiments, the under-fill layer 402 is made of materials including epoxy.

In some embodiments, the antenna packaging structure also includes a dam & fill protective layer 403, and the under-fill layer 402 together with the dam & fill protective layer 403 envelops the semiconductor chips 401.

In some embodiments, the dam & fill protective layer 403 is made of materials including epoxy.

Specifically, in FIGS. 18-19, the first opening 501 exposes the metal wires in the rewiring layer, and defines the position where the metal bumps 502 is subsequently formed. In some embodiments, there is a gap between the first opening 501 and the semiconductor chips 401. The gap serves to facilitate subsequent packaging processes. In addition, the metal bumps 502 may be preliminarily fixed on the rewiring layer, and the metal bumps 502 may be made of one of tin solder, silver solder, and gold-tin alloy solder.

In some embodiments, the antenna packaging structure also includes an under-fill layer 402. The under-fill layer 402 helps with improving the packaging stability of the semiconductor chips 401. In some embodiments, the antenna packaging structure also includes a dam & fill protective layer 403. The dam & fill protective layer 403 helps with improving the stability of the semiconductor chips 401, and offers protection for the semiconductor chips 401. The dam & fill protective layer 403 and the under-fill layer 402 surround the semiconductor chips 401, offering a hermetical seal to protect the semiconductor chips 401. In some embodiments, the under-fill layer 402 is made of epoxy. In some embodiments, the dam & fill protective layer 403 is made of epoxy.

In addition, in some embodiments, the third packaging layer 503 is made of one of silica gel and epoxy. The third packaging layer 503 helps to further stabilize the metal bumps 502. In some embodiments, the metal bumps 502 is fixed to the third packaging layer 503 by molding. In some embodiments, laser technology is used to laser drill in the third packaging layer 503 to form the second opening 504. The second opening 504 exposes the metal bumps 502. In some embodiments, as shown in FIG. 23, the second opening 504 is not a through hole in the third packaging layer 503, which means less energy and time is employed to form the second opening 504.

Additionally, when there is a dam & fill protective layer 403, the third packaging layer also encapsulates the dam & fill protective layer 403, which increases the device's stability in some embodiments.

Compared to the existing technologies, simultaneous packaging of the semiconductor chips and the metal bumps is able to improve the stability of the packaging structure. Also, adopting the multi-layered antenna structure which comprises multiple layers of metal feedline pillars and multiple packaging layers can reduce the device's package size, which leads to better reception and higher receiver bandwidth. In addition, the under-fill layer serves to improve the stability of the semiconductor chips. The under-filling process is performed before the metal bumps are formed, which helps to reduce the metal bumps' interference to the under-filling process. The dam & fill protective layer adds an extra protection to the semiconductor chips. Aligning the semiconductor chips, the rewiring layer stack, and metal antennas elements in a vertical structure shortens the conduction path between various components, and leads to better electrical properties, higher antenna efficiency, and lower power consumption.

While particular elements, embodiments, and applications of the present invention have been shown and described, it is understood that the invention is not limited thereto because modifications may be made by those skilled in the art, particularly in light of the foregoing teaching. It is therefore contemplated by the appended claims to cover such modifications and incorporate those features which come within the spirit and scope of the invention.

List of Reference Numerals in the Disclosure:

101 supporting substrate
102 temporary bonding layer
201 first dielectric layer
202 first metal wiring layer
203 second dielectric layer
204 second metal wiring layer
301 first antenna layer
302 first lower metal layer
303 first metal feedline pillars
304 first packaging material layer
305 first packaging layer
306 first protective adhesive layer
307 second antenna layer
308 second lower metal layer
309 second metal feedline pillars
310 second packaging material layer
311 second packaging layer
312 third antenna layer
401 semiconductor chip
402 under-fill layer
403 dam & fill protective layer
501 first opening
502 metal bump
503 third packaging layer
504 second opening
S1-S15 processe steps of an antenna packaging method

What is claimed is:

1. A method for packaging antennas, comprising:

forming a temporary bonding layer on a supporting substrate;

forming a rewiring layer on the temporary bonding layer, wherein the rewiring layer comprises a first surface coupled to the temporary bonding layer, and a second surface being opposite to the first surface;

fabricating a first antenna layer on the second surface of the rewiring layer, wherein the first antenna layer is electrically connected to the rewiring layer;

fabricating first metal feedline pillars on the first antenna layer, wherein the first metal feedline pillars are electrically connected to the first antenna layer;

encapsulating the first metal feedline pillars with a first packaging layer, wherein the top surfaces of the first metal feedline pillars are exposed on the first packaging layer;

fabricating a second antenna layer on the first packaging layer, wherein the second antenna layer is electrically connected to the first metal feedline pillars;

fabricating second metal feedline pillars on the second antenna layer, wherein the second metal feedline pillars are electrically connected to the second antenna layer;

encapsulating the second feedline pillars with a second packaging layer, wherein the top surfaces of the second feedline pillars are exposed on the second packaging layer;

fabricating a third antenna layer on the second packaging layer, wherein the third antenna layer is electrically connected to the second feedline pillars;

peeling the temporary bonding layer along with the supporting substrate off from the rewiring layer, to expose the first surface of the rewiring layer;

forming a first opening on the first surface of the rewiring layer;

fabricating one or more semiconductor chips on the first surface of the rewiring layer, wherein the one or more semiconductor chips are electrically connected to the rewiring layer;

forming a metal bump in the first opening, wherein the metal bump is electrically connected to the rewiring layer;

encapsulating the one or more semiconductor chips and the metal bump using a third packaging layer; and forming a second opening in the third packaging layer, wherein the metal bump is exposed from the second opening.

2. The method for packaging antennas according to claim 1, wherein the supporting substrate includes one of a glass substrate, a metal substrate, a semiconductor substrate, a polymer substrate, and a ceramic substrate.

3. The method for packaging antennas according to claim 1, wherein the temporary bonding layer includes a light-to-heat conversion layer, wherein the light-to-heat conversion layer peels off along with the supporting substrate from the rewiring layer after receiving laser radiation, which causes the rewiring layer and the supporting substrate to separate from each other.

4. The method for packaging antennas according to claim 1, wherein forming the rewiring layer comprises:

forming a first dielectric layer on the temporary bonding layer;

forming a seeding layer on the first dielectric layer by sputtering;

forming a first metal layer on the first seeding layer;

patterning the first metal layer and the seeding layer to form a first metal wiring layer;

forming a second dielectric layer on the first metal wiring layer;

patterning the second dielectric layer to obtain through-holes in the second dielectric layer;

filling with conductive plugs in the patterned through-holes;

forming a second metal layer on the second dielectric layer by sputtering; and patterning the second metal layer to form a second metal wiring layer.

5. The method for packaging antennas according to claim 1, wherein the method further comprises:

after fabricating the first antenna layer, forming a first protective adhesive layer on the rewiring layer to cover the first antenna layer, wherein the first metal feedline pillars are formed on the first antenna layer and extend through the first protective adhesive layer, and wherein the first packaging layer is formed on the first protective adhesive layer;

or after fabricating the second antenna layer, forming a second protective adhesive layer on the first packaging layer to cover the second antenna layer, wherein the second metal feedline pillars are formed on the second antenna layer and extend through the second protective adhesive layer, and wherein the second packaging layer is formed on the second protective adhesive layer.

6. The method for packaging antennas according to claim 1, wherein the method further comprises:

before fabricating the first metal feedline pillars, forming a first lower metal layer on the first antenna layer, wherein the first metal feedline pillars are fabricated on the first lower metal layer, and wherein the first metal feedline pillars are fabricated using wire bonding techniques, electroplating techniques, or electroless plating techniques;

or before fabricating the second metal feedline pillars, forming a second lower metal layer on the second antenna layer, wherein the second metal feedline pillars are fabricated on the second lower metal layer, and wherein the second metal feedline pillars are fabricated using wire bonding techniques, electroplating techniques, or electroless plating techniques.

7. The method for packaging antennas according to claim 1, wherein a number of the semiconductor chips is two or more, wherein the semiconductor chips are active devices and passive devices, wherein the active devices comprise a power management circuit, a transmitting circuit, and a receiving circuit, and/or the passive devices comprise resisters, capacitors and inductors.

8. The method for packaging antennas according to claim 1, wherein after fabricating the one or more semiconductor chips, the method further comprises:

forming an under-fill layer to fill the semiconductor chips, wherein the under-fill layer is disposed between the one of the semiconductor chips and the rewiring layer.

9. The method for packaging antennas according to claim 8, wherein after under-filling one or more of the semiconductor chips the method further comprises:

encapsulating the semiconductor chips with a dam & fill protective layer, wherein the dam & fill protective layer covers at least a bottom and sides of one or more of the semiconductor chips, wherein the dam & fill protective layer along with the under-fill layer seal one or more the semiconductor chips, and wherein the third packaging layer encapsulates the dam & fill protective layer.

10. An antenna packaging structure, comprising:

a rewiring layer, wherein the rewiring layer includes a first surface and a second surface opposite to the first surface, wherein the rewiring layer comprises an opening formed on the first surface;

a first antenna layer, formed on the second surface and electrically connected to the rewiring layer;

first metal feedline pillars, formed on the first antenna layer and electrically connected to the first antenna layer;

a first packaging layer, covering the first metal feedline pillars except exposing top surfaces of the first metal feedline pillars;

a second antenna layer, formed on the first packaging layer and electrically connected to the first metal feedline pillars;

second metal feedline pillars, formed on the second antenna layer and electrically connected to the second antenna layer;

a second packaging layer, covering the second metal feedline pillars except exposing top surfaces of the second metal feedline pillars;

a third antenna layer, formed on the second packaging layer and electrically connected to the second metal feedline pillars;

one or more semiconductor chips, each coupled to the first surface and electrically connected to the rewiring layer;

a metal bump, formed in a first opening on the first surface of the rewiring layer and electrically connected to the rewiring layer; and a third packaging layer, encapsulating one or more of the semiconductor chips and the metal bump, wherein the third packaging layer includes a second opening exposing the metal bump.

11. The antenna packaging structure according to claim 10, further comprising:

a first lower metal layer in a connection area between the first metal feedline pillars and the first antenna layer, wherein the first lower metal layer is made of one of gold, silver, copper, and aluminum, and includes a laminated layer including a nickel layer and a gold layer; or a second lower metal layer in a connection area between the second metal feedline pillars and the second antenna layer, wherein the second lower metal layer is made of one of gold, silver, copper, and aluminum, and includes a laminated layer including a nickel layer and a gold layer.

12. The antenna packaging structure according to claim 10, further comprising:

a first protective adhesive layer covering the first antenna layer, wherein the first metal feedline pillars are formed on the first antenna layer and penetrate the first protective adhesive layer; or a second protective adhesive layer covering the second antenna layer, wherein the second metal feedline pillars are formed on the second antenna layer and penetrate the second protective adhesive layer.

13. The antenna packaging structure according to claim 10, wherein the first packaging layer is made of one of silica gel, and epoxy, wherein the second packaging layer is made of one of silica gel, and epoxy, and wherein the third packaging layer is made of one of silica gel, and epoxy.

14. The antenna packaging structure according to claim 10, wherein a number of the semiconductor chips is more than two, and the semiconductor chips comprise active devices, and/or passive devices, wherein the active devices comprise a power management circuit, a transmitting circuit, and a receiving circuit, and the passive devices comprise resistanters, capacitors, and inductors.

15. The antenna packaging structure according to claim 10, further comprising:

an under-fill layer, formed between the semiconductor chips and the rewiring layer.

16. The antenna packaging structure according to claim 15, further comprising:

a dam & fill protective layer, wherein the dam & fill protective layer covers at least a bottom and sides of the semiconductor chips, wherein the dam & fill protective layer along with the under-fill layer surround the semiconductor chips; and wherein the third packaging layer encapsulates the dam & fill protective layer.

* * * * *